United States Patent [19]
Takahashi et al.

[11] Patent Number: 5,153,987
[45] Date of Patent: Oct. 13, 1992

[54] PROCESS FOR PRODUCING PRINTED WIRING BOARDS

[75] Inventors: Hiroshi Takahashi, Kasama; Shin Takanezawa, Shimodate; Masao Kanno, Shimodate; Toshiro Okamura, Shimodate; Naoki Fukutomi; Hiroyoshi Yokoyama, both of Yuki; Hideo Watanabe, Kanagawa; Hajime Yamazaki, Hadano; Hiroyuki Wakamatsu, Kawasaki; Toshinobu Takahashi, Kanagawa, all of Japan

[73] Assignees: Hitachi Chemical Company, Ltd.; Hitachi, Condenser Co., Ltd.; Yokohama Rubber Company Limited, all of Tokyo, Japan

[21] Appl. No.: 335,433

[22] Filed: Apr. 10, 1989

[30] Foreign Application Priority Data

Jul. 15, 1988 [JP] Japan ............................ 63-175132
Jul. 15, 1988 [JP] Japan ............................ 63-175133
Aug. 26, 1988 [JP] Japan ............................ 63-210460

[51] Int. Cl.⁵ ........................................... H05K 3/12
[52] U.S. Cl. .......................................... 29/852; 29/848; 427/97
[58] Field of Search ................. 29/840, 846, 852, 853, 29/848; 427/97, 98, 282, 292, 443.1, 443.2; 156/644, 645, 656, 668, 902, 659.1; 174/68.5

[56] References Cited

U.S. PATENT DOCUMENTS

| | | |
|---|---|---|
| 4,389,268 | 6/1983 | Oshima et al. |
| 4,585,502 | 4/1986 | Uozu et al. ................. 29/840 X |
| 4,770,900 | 9/1988 | Seibel ............................. 427/97 |
| 4,804,615 | 2/1989 | Larson et al. ............. 427/97 X |

FOREIGN PATENT DOCUMENTS 51-60958 5/1976 Japan.

Primary Examiner—Joseph M. Gorski
Assistant Examiner—Peter Dungba Vo
Attorney, Agent, or Firm—Antonelli, Terry Stout & Kraus

[57] ABSTRACT

By using a composite film comprising an additive layer and an insulating layer containing an epoxy resin and a synthetic rubber as major components, printed wiring boards having a higher circuit density and higher reliability can be produced simply and effectively.

12 Claims, 5 Drawing Sheets

PROCESS FOR PRODUCING PRINTED WIRING BOARDS

BACKGROUND OF THE INVENTION

This invention relates to a process for producing a multi-layer printed wiring board having high reliability with high efficiency by an additive process and a composite film used therein.

Multi-layer printed wiring boards applied to various electric products are generally produced by laminating a plurality of inner circuit substrates and outer circuit plates via prepregs and binding them (e.g. Japanese Patent Examined Publication No. 38-14977). Under such circumstances, since a large apparatus and long steps are necessary, there is a limit to lowering the production cost. Further, since unevenness of inner circuit substrates appear on surfaces of outer layers, defects are readily formed at the time of forming out circuits. This causes a limit to a wiring density. In order to improve this, there is proposed a process comprising forming an insulating resin layer on an inner circuit substrate, forming a resin adhesive layer for electroless plating, curing these resins with heating, and forming outer layer circuits and through-hole conductors by electroless plating using an additive process (e.g. Japanese Patent Unexamined Publication No. 60-5198895).

A typical additive process is explained referring to FIGS. 6(A) to 6(C). On both sides of a printed circuit substrate 3 obtained by forming copper patterns 2 on both sides of an insulating substrate 1 (FIG. 6(A)), insulating layers 4 are formed (FIG. 6(B)), followed by forming additive layers 5 thereon (FIG. 6(C)). Surfaces of the additive layers 5 are roughened (surface treatment for imparting affinity for water) j with a chromic acid mixed solution ($CrO_3 + H_2SO_4$), and subjected to a surface activation treatment for providing a catalyst such as palladium chloride on the surfaces, provided that no catalyst is adhered previously. The surfaces are masked with a photosensitive lacquer (a photo resist) by a photographic method or by a screen printing method (formation of resist films) on non-circuit forming portions, followed by electroless plating on circuit forming portions. Lamination of the insulating layers 4, followed by lamination of the additive layers 5 are conducted by processes (under reduced pressure) as disclosed in Japanese Patent Unexamined Publication Nos. 62-236726 and 62-236727. As the printed circuit substrate 3 shown in FIG. 6(A), there are generally used copper-clad laminates formed by a conventional substrate process. But the process as shown by FIGS. 6(A) to 6(C) are complicated and requires much more time and much more labor.

With recent requirement for miniaturization and higher performance of electronic devices, multilayer printed wiring boards are required to have a higher density. In order to have a higher density, the width of conductors is required to be smaller, which results in requiring smoother surfaces. In order to meet such a requirement, Japanese Patent Unexamined Publication No. 51-60958 proposes to laminate a transferring sheet obtained by previously coating a resin on a base plate on a printed wiring substrate in place of coating a resin thereon. By this method, uniform thickness of the resin layers can be obtained and surface smoothness can be obtained to some extent, but there are still problems in that adhesiveness between the resin and conductors is insufficient, difficulty in practical application is caused by narrowing the circuit conductor width in order to obtain the higher density.

On the other hand, in order to quickly remove heat generated by parts mounted on printed circuit boards, to have high thermal conductivity is required. For such a purpose, a metal plate having good heat dissipation is used as a substrate for printed wiring boards. Such a metal plate has a number of through-holes with insulating layers formed on surfaces thereof. The insulating layers are formed by electrodeposition of an insulating varnish, powder coating of an insulating resin composition, and the like. According to the electrodeposition method, coating film with uniform thickness can be obtained but there are problems in controlling of an electrodeposition solution, disposal of waste liquor, and the like. On the other hand, according to the powder coating method, there are problems in that the thickness of a resin layer at through-hole edge portions which are boundaries of through-holes and plane portions is remarkably reduced by agglomeration of molten material due to surface tension at the stage of melting and curing the powder on the metal plate, pin holes are easily produced at the edge portions concentratively due to concentration of shrinking stress at curing caused by the difference in thickness. The presence of pin holes is a fatal defect in function of printed wiring boards.

SUMMARY OF THE INVENTION

It is an object of the present invention to provide a process for producing a multi-layer printed wiring board having a higher circuit density and higher reliability by a simple method overcoming defects of prior art technique.

It is another object of the present invention to provide a composite film used in such a process.

It is a further object of the present invention to provide a process for producing a printed wiring board having no pin holes and good in heat dissipation.

The present invention provides a process for producing a printed wiring board which comprises laminating a composite film comprising an additive layer (or adhesive layer) and an insulating resin layer containing an epoxy resin and a synthetic rubber as major components on both sides of a substrate under reduced pressure, curing the resulting laminate with heating, followed by conventional steps employed in an additive process.

The present invention also provides a process for producing a multi-layer printed wiring board which comprises binding a composite film comprising an insulating resin layer and an adhesive layer to both sides of an inner layer circuit substrate so as to contact the insulating resin layer with the inner layer circuit substrate, heating under pressure the resulting laminate to bind, and forming outer circuits and through-hole conductors by conventional steps employed in an additive process.

The present invention further provides a composite film for producing a printed wiring board by an additive process comprising an additive layer (or adhesive layer) and an insulating resin layer containing an epoxy resin and a synthetic rubber as main components.

The present invention still further provides a process for producing a printed wiring board which comprises filling a resin composition in through-holes of a metal plate, laminating an uncured additive layer film on both sides of the metal plate to give a laminate, curing the additive layer film with heating, drilling smaller through-holes at the original through-hole portions, and forming conductor circuits on surfaces of the resulting laminate by conventional steps employed in an additive process.

DESCRIPTION OF THE PREFERRED EMBODIMENTS

Figure 1:
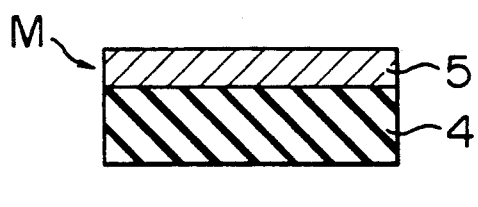
FIGS. 1 to 4 are cross-sectional views of composite films used in the present invention.

The composite film (M) used in the present invention comprises an insulating resin layer 4 and an additive layer (or an adhesive layer) 5 as shown in FIG. 1. The additive layer means an organic layer on which circuits are formed by electroless plating. The insulating resin layer means an organic layer having an insulating function against inner layer circuits. By the presence of the insulating resin layer 4, good laminating properties on inner layer circuits under reduced pressure and possibility of curing under an atmospheric pressure are obtained.

The insulating resin layer 4 is made of an epoxy resin and a synthetic rubber as major components. As the epoxy resin, there can be used bisphenol type epoxy resins, epichlorohydrin type epoxy resins, novolak type epoxy resins, alicyclic type epoxy resins, etc., alone or as a mixture thereof. In order to impart flame retardancy, the use of brominated epoxy resins is preferable.

As the synthetic rubber, there can be used styrene-butadiene rubber (SBR), butadiene rubber (BR), acrylonitrile-butadiene rubber (NBR), chloroprene rubber, isoprene rubber, butyl rubber, etc., alone or as a mixture thereof. Among them, the use of NBR is more preferable. Particularly, the use of NBR containing 20 to 50% by weight of acrylonitrile and having a Mooney viscosity ($ML_{1+4}$, 100° C.) of 25 to 80 is particularly preferable.

Mixing ratio of the epoxy resin to the synthetic rubber, e.g. NBR (epoxy resin/rubber) is preferably in the range of 30/70 to 90/10. When the ratio is less than 30/70 (the epoxy resin being less than 30 and the rubber more than 70), since layer insulation properties as well as flowing properties are lowered, flowing into spaces among circuits at the time of laminating on inner layer circuit substrates (printed circuit substrates) becomes insufficient. On the other hand, when the ratio is more than 90/10 (the epoxy resin being more than 90 and the rubber less than 10), adhesiveness to copper patterns of inner layer circuit substrates is lowered, flowing becomes too much at the time of lamination on inner layer circuit substrates, and resin flow takes place at the time of curing with heating so as to make it difficult to maintain uniform thickness between layers.

The additive layer 5 (or adhesive layer for electroless plating) is made of a blend of a rubber component such as NBR, BR, SBR, etc., and a thermosetting resin component such as a phenol resin, an epoxy resin, a melamine resin, etc.

At the time of laminating the composite films on an inner layer circuit substrate, the insulating resin layer 4 is in an uncured state in order to improve the adhesiveness to copper patterns on the inner layer circuit substrates, but the additive layer 5 can either be uncured or cured. The viscosity of insulating layer at the time of laminating on an inner layer circuit substrate is preferably in the range of $10^3$ to $10^5$ poises. When the viscosity is less than $10^3$ poises, flowing properties becomes too much, resulting in making it difficult to maintain a uniform thickness as the insulating resin layer. On the other hand, when the viscosity is more than $10^5$ poises, flowing into spaces between circuits becomes insufficient.

The composite film M wherein the additive layer 5 is uncured can be prepared by coating an insulating layer 4 on a surface of a release film and an additive layer 5 is coated on a surface of another release film, followed by binding the surface of insulating layer 4 to the surface of additive layer 5. As the release film, there can be used those having releasing properties such as a polyethylene terephthalate (PET) film, a polyester film treated with a silicone, release paper, a metal foil such as aluminum foil treated with a wax, etc., for imparting releasing properties.

The composite film M wherein the additive layer 5 is cured can be prepared by coating an insulating layer 4 on a previously cured additive layer 5. When the additive layer 5 is cured, since diffusion of the components of the insulating layer 4 into the additive layer 5 can be prevented, roughening of the additive layer 5 for electroless plating becomes easy.

Figure 2:
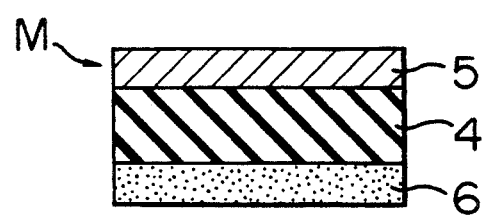

In order to enhance the adhesiveness to inner layer circuit substrates, an adhesive layer 6 may be formed on the insulating layer 4 as shown in FIG. 2. The formation of the adhesive layer 6 can be carried out by coating an adhesive on the insulating layer 4. The surface of adhesive layer 6 can be protected by covering a release film as mentioned above.

As the adhesive, there can be used conventionally used epoxy resins. The viscosity of the adhesive layer 6 at the time of formation (120° C. at most) is preferably in the range of $10^3$ to $10^5$ poises as in the case of the insulating layer 4.

Figure 3:
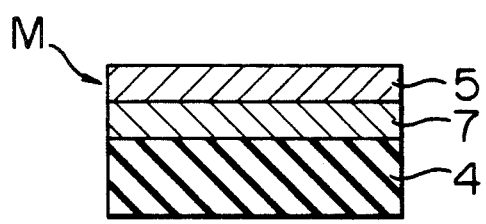

In order to prevent the diffusion of the components of insulating layer 4 into the additive layer 5, a barrier layer 7 may be interposed between the insulating layer 4 and the additive layer 5 as shown in FIG. 3. As the barrier layer 7, there can be used a PET film, a polyimide film, and the like thin film.

Figure 4:
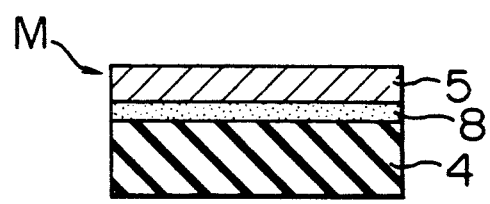

Another method for preventing the diffusion of the components of insulating layer 4 into the additive layer 5 is to cure the portion 8 of the insulating layer 4 in contact with the additive layer 5 as shown in FIG. 4. In this case, on one side of the previously cured portion 8, an insulating layer 4 having the same composition as the portion 8 can be positioned, and on the other side an additive layer 5 can be positioned.

Figure 5:
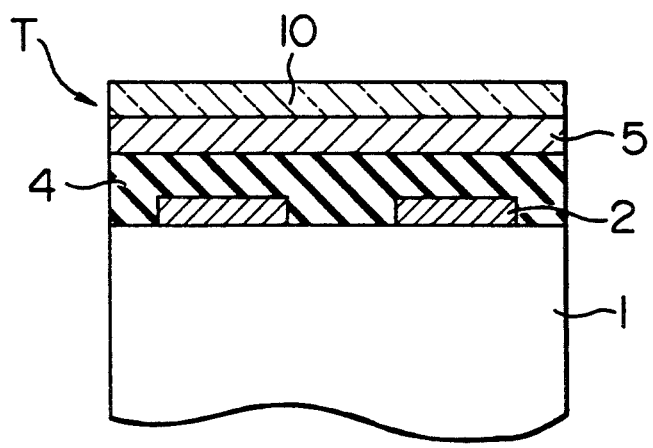
FIG. 5 is a partial cross-section view of a laminate obtained by laminating a composite film on a circuit substrate under reduced pressure.
Figure 6A:
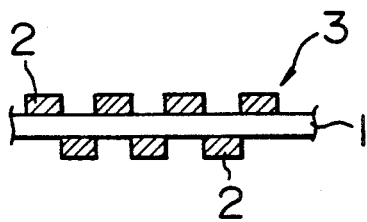
FIGS. 6(A) to 6(C) are cross-sectional views explaining a prior art additive process for producing a multi-layer circuit substrate.
Figure 6B:
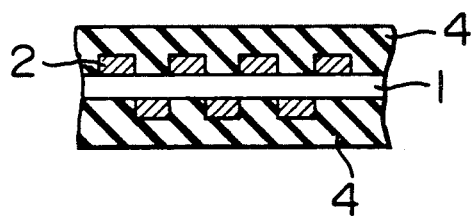
Figure 6C:
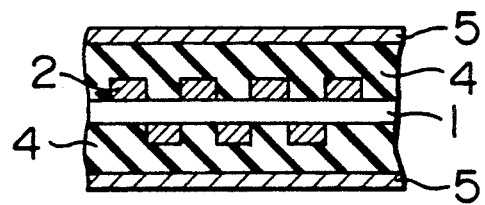

The composite film M is laminated on a circuit substrate (the same one as the printed circuit substrate 3 shown in FIG. 6(A)) under reduced pressure. Such lamination can be carried out using a vacuum laminator. The pressure is preferably in the range of several Torr to several tens Torr. It is necessary to carry out the lamination under reduced pressure in order to prevent the generation of voids among layers. Thus the laminate T as shown in FIG. 5 is obtained. In FIG. 5, numeral 10 denotes a release film.

The insulating substrate to be covered with the composite film M is not particularly limited and may be a conventionally used one. It is possible to use a laminate of 0.1 to 0.05 mm thick, which laminate is difficult for forming an additive layer by a dip coating method or a curtain coating method.

In FIG. 5, copper patterns 2 (inner layer circuit) are positioned on an upper surface of an insulating substrate 1, and an insulating layer 4 and an additive layer 5 are laminated thereon.

The laminate T is then cured with heating preferably at 120° to 170° C. for 1 to 4 hours. Then, the additive layer surface is subjected to an activating treatment and electroless plating by a conventional additive process to produce a printed wiring board.

When the composite film contains no electroless plating catalyst such as palladium chloride, platinum chloride, etc., or only the insulating layer in the composite film contains an electroless plating catalyst, a printed wiring board can be produced by lamination of the composite film, surface roughening, seeding of an electroless plating catalyst, masking with a resist, and electroless plating for forming conductor patterns.

On the other hand, when an electroless plating catalyst is contained in both the insulating layer and the adhesive layer of the composite film, a printed wiring board can be produced by either (i) lamination of the composite film, surface roughening, masking with a resist and electroless plating for forming conductor patterns, or (ii) lamination of the composite film, masking with a resist, surface roughening and electroless plating for forming conductor patterns.

Figure 8:
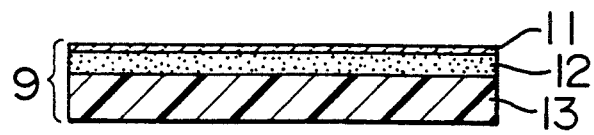
FIG. 8 is a cross-sectional view of a composite film used in FIGS. 7(A) to 7(F).

In the production of multi-layer printed wiring boards by an additive process, surface smoothness having a negligible label difference between circuit patterns and the insulating material is necessary. In such a case, there is used a composite film 9 as shown in FIG. 8 wherein numeral 13 denotes an insulating resin layer and numeral 12 denotes an adhesive layer, and numeral 11 denotes an insulating film.

As the insulating resin layer 13, there can be used the same materials as explained in the insulating layer 4, as well as compositions comprising as a major component a thermosetting resin component such as epoxy resins, epoxy modified polybutadiene resins, phenol resins, modified polyamide-imide resins, modified polyimide resins, or a mixture thereof, and a polymer having flexibility such as BR, SBR, NBR, phenoxy resin or a mixture thereof, and if necessary one or more inorganic fillers.

As the adhesive layer 12 for electroless plating, there can be used the same material as explained in the additive layer 5.

The composite film 9 may preferably contain a catalyst for electroless plating such as palladium, platinum, or the like, at least in the adhesive layer 12.

The thickness of the composite film 9 is preferably 20 to 500 μm, more preferably 50 to 250 μm. By making the thickness of the insulating resin layer 13 10 to 400 μm, preferably 20 to 200 μm, surface smoothness of outer layers and easiness in preparation of the composite film 9 can be obtained.

Further, by making the flowing properties of the insulating resin layer 13 at the time of pressing with heating layer than those of the adhesive layer 12 at the time of pressing with heating, surface smoothness after press bonding can be obtained.

When an insulating film 11 is adhered to the adhesive layer 12 as shown in FIG. 8, handling of the composite film is improved. Further, by removing the insulating film from the composite film immediately before a pretreatment for electroless plating, adhesion of dusts can be prevented and adhesiveness between an outer circuit 18 (see FIG. 7(F)) and the adhesive layer 12 can be enhanced.

Moreover, since the composite film 9 can be formed by coating the adhesive layer 12 and the insulating resin layer 13 on the insulating film, continuous coating and drying is possible so as to make the production process effective and economical.

In this case, when the lamination of the composite film is carried out under reduced pressure as mentioned above, the generation of voids between inner layer circuits can effectively be prevented.

A printed wiring board having no pin holes and good in heat dissipation can be produced as shown in FIGS. 9(A) to 9(G).

Figure 9A:
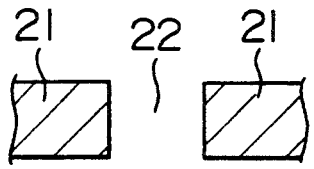
FIGS. 9(A) to 9(G) are cross-sectional views explaining a process of the present invention.

FIG. 9(A) shows a metal plate 21 having a through-hole 22 having a diameter of about 2 mm. As the metal plate 21, there can be used those having good heat dissipation and good thermal conductivity such as an aluminum plate, a silicon steel plate, an iron plate, a stainless steel plate, a copper plate, etc. It is possible to use a sheet or a layer obtained by binding a metal powder, a metal fiber or cut fiber of metal with a small amount of a binder. The thickness of metal plate 21 is not particularly limited. But when too thin, heat dissipation effect is lowered, while when too thick, the weight becomes too much.

Figure 9B:
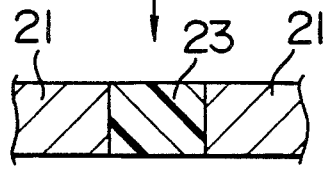

The through-hole 22 of the metal plate 21 is filled with a resin composition and the metal plate 21 is laminated with an uncured additive layer film. In this case, the uncured additive layer film may be laminated on one or both sides of the metal plate 21 after filling the resin composition in the through-hole 21, or after laminating an additive film layer on one side of the metal plate 21, the resin composition is filled in the through-hole 22, followed by laminating an additive layer film on another side of the metal plate 21. In FIG. 9(B), an uncured resin composition 23 is first filled in the through-hole 22 of the metal plate 21, followed by curing the resin composition 23 (e.g. 120° C. for about 1 hour). As the resin composition 23, there can be used those having the same compositions as the additive layer films. The filling of the resin composition 23 in the through-hole 22 can be carried out by a conventional method such as a screen printing method, etc.

Figure 9C:
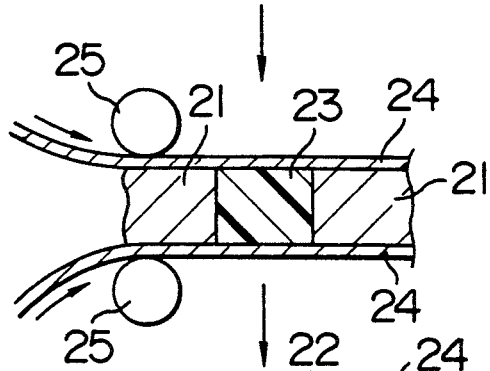

After filling the resin composition 23, uncured additive films 24 are laminated on both sides of the metal plate 21 while pressing by pressing rolls 25 from the both sides as shown in FIG. 9(C), followed by curing of the additive layer films 24 with heating (at 150° C. for about 1 hour).

As the additive layer film 24, there can be used those which are usually used as an additive layer. For example, there can be used a blend of a rubber component such as NBR, BR, SBR, etc., and a thermosetting resin composition such as a phenol resin, an epoxy resin, a melamine resin, etc.

Figure 9D:
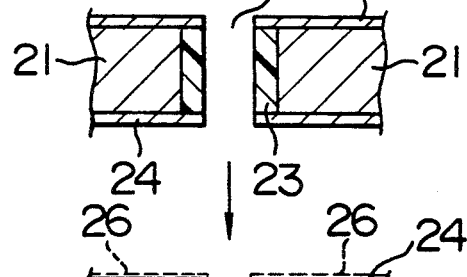

Then, as shown in FIG. 9(D), a through-hole 22 is perforated by drilling (hole diameter, about 1 mm). The perforation of through-hole can be carried out using a drill, etc.

Figure 9E:
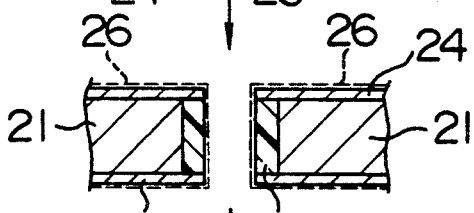
Figure 9F:
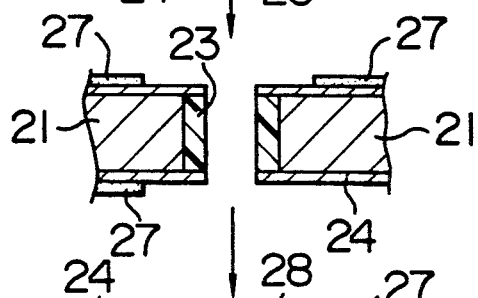
Figure 9G:
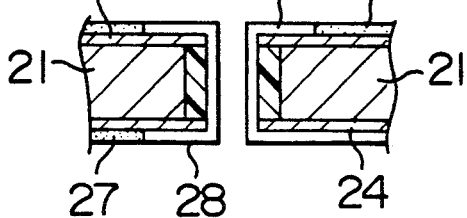

Conductor circuits are, then, formed on surfaces of the thus treated laminate by an additive process. In this case, after roughening surfaces of the additive layer films 24 (with a chromic acid mixed solution at 45° C. for about 10 minutes), a surface activating treatment is conducted by providing a catalyst 26 (palladium chloride) on surfaces thereon as shown in FIG. 9(E). Then, as shown in FIG. 9(F), non-circuit forming portions on the surfaces are masked with a photo resist 27 by a photographic method, followed by plating as shown in FIG. 9(G) to form plating films 28. Then, post curing is carried out at 160° C. for about 1 hour. The plating can be carried out by electroless plating or a combination of electroless plating and electroplating.

Figure 10:
FIGS. 10 and 11 are cross-sectional views explaining states of additives layers before use.

The uncured additive layer film 24 may be covered with a release film 30 such as a PET film as shown in FIG. 10. The release film 30 can be removed after laminating the uncured additive layer film 24 on the metal plate 21 or after curing of the uncured additive layer 24.

Figure 11:
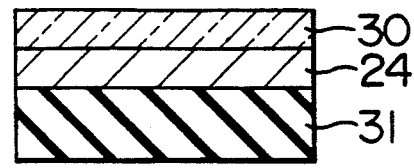

Further, as shown in FIG. 11, an insulating layer 31 may be laminated on an undersurface of the uncured additive layer film 24, followed by lamination of the uncured additive layer film 24 on the metal plate 21 via the insulating layer 31. The insulating layer 31 is an organic layer having insulating function and comprising an epoxy resin and a synthetic rubber as major components as explained as to the insulating resin layer 4.

The present invention is illustrated by way of the following Examples, wherein all the parts and percents are by weight unless otherwise specified.

EXAMPLE 1

| Additive layer | |
|---|---|
| NBR (nitrile content 41%) | 60 parts |
| Phenol resin (resol type) | 35 parts |
| Epoxy resin (bisphenol-epichlorohydrin type, epoxy equivalent weight 500) | 5 parts |
| Calcium carbonate | 15 parts |
| Peroxide | 6 parts |
| Diphenylguanidine | 0.1 part |

The ingredients mentioned above were dissolved in methyl ethyl ketone (MEK) to form a MEK solution, which was then coated on a release film (PET film) so as to make the film thickness 35 μm after dried to form an uncured film (an additive layer film).

| Insulating layer | |
|---|---|
| Epoxy resin (bisphenol-epichlorohydrin type, epoxy equivalent weight 500) | 100 parts |
| NBR (nitrile content 33%) | 40 parts |
| Calcium carbonate | 20 parts |
| Imidazole compound | 5 parts |
| Peroxide | 1 part |
| Diphenylguanidine | 0.1 part |

The ingredients mentioned above were dissolved in methyl ethyl ketone to form a 45% MEK solution, which was coated on a release film (PET film) so as to make the film thickness 100 μm after dried to form an uncured film (an insulating film). The viscosity of resulting film measured by DMA (dynamic mechanical analysis) was 1100 poises at 120° C., 9000 poises at 100° C., 45000 poises at 80° C. and 85000 poises at 70° C.

A composite film was obtained by binding the additive layer film with the insulating layer film using a roll laminator at 80° C.

The composite film was vacuum laminated (100° C.) on a circuit substrate having comb teeth-like circuits with line and space (L/S) of 0.5 mm (1 ounce of electroplated copper) so as to make the insulating layer contact with the circuit substrate. After measuring flowing properties into spaces between circuits, it was confirmed that no voids were formed.

The composite film laminated substrate was cured by heating at 150° C. for 2 hours in an electric oven, followed by a roughening treatment using a chromic acid mixed solution according to a usual additive process. After seeding a catalyst and activation treatment, electroless plating was carried out to deposit copper with a predetermined thickness, followed by annealing to give a printed wiring board.

The resulting printed wiring board was good in both adhesiveness of the electroless plated copper (JIS C 6481. 5. 7) and solder heat resistance at 260° C. (JIS C 6481. 5. 5).

EXAMPLE 2

A composite film was obtained by binding the same additive layer film as obtained in Example 1 previously cured by heating at 150° C. for 1 hour, with the same insulating layer film (100 μm) as obtained in Example 1 using a roll laminator at 100° C.

The composite film was vacuum laminated (100° C.) on a circuit substrate having comb teeth-like circuits with line and space (L/S) of 0.5 mm (1 ounce of electroplated copper) so as to make the insulating layer contact with the circuit substrate. After measuring flowing properties into spaces between circuits, it was confirmed that no voids were formed.

A printed wiring board was produced in the same manner as described in Example 1.

The resulting printed wiring board was good in both adhesiveness of the electroless plated copper and solder heat resistance at 260° C.

EXAMPLE 3

| Adhesive layer | |
|---|---|
| Epoxy resin (bisphenol-epichlorohydrin type, epoxy equivalent weight 500) | 100 parts |
| NBIR (acrylonitrile-butadiene-isoprene terpolymer rubber, nitrile content 33%) | 40 parts |
| Calcium carbonate | 20 parts |
| Diphenylguanidine | 6 parts |
| Diphenylthiourea | 1 part |
| Tetramethylthiuram sulfide | 2 parts |

The ingredients mentioned above were dissolved in MEK to give a 48% MEK solution, which was coated on a release film (PET film) so as to make the film thickness 30 μm after dried to form an uncured film (an adhesive film). The viscosity of the resulting film measured by DMA was 3000 poises at 100° C. and 15000 poises at 80° C.

A composite film comprising an additive layer, an insulating layer and an adhesive layer was obtained by binding the additive layer film (35 μm thick) obtained in Example 1, the insulating layer film (uncured film with 70 μm thick) obtained in Example 1 and the above-mentioned adhesive layer film using a roll laminator at 80° C.

The composite film was vacuum laminated (80° C.) on a circuit substrate having comb teeth-like circuits with line and space (L/S) of 0.5 mm (1 ounce of electroplated copper) so as to make the insulating layer contact with the circuit substrate. After measuring flowing properties into spaces between circuits, it was confirmed that no voids were formed.

A printed wiring board was produced in the same manner as described in Example 1.

The resulting printed circuit board was good in both adhesiveness of the electroless plated copper and solder heat resistance at 260° C.

EXAMPLE 4

Using the same additive layer film (35 μm thick, containing 0.03 part of palladium chloride as a plating catalyst) as obtained in Example 1, insulating layer films [obtained by coating the same 45% MEK solution as used in Example 1 but containing 0.03 part of palladium chloride as a plating catalyst on a release film (PET film) so as to make the film thickness 50 μm after dried to form uncured films, one of which was cured with heating at 150° C. for 1 hour], a composite film comprising an additive layer, an insulating layer (cured) and an insulating layer (uncured) was prepared by binding the films mentioned above using a roll laminator at 120° C.

The composite film was vacuum laminated (100° C.) on a circuit substrate having comb teeth-like circuits with line and space (L/S) of 0.5 mm (1 ounce of electrodeposited copper) so as to make the insulating layer contact with the circuit substrate. After measuring flowing properties into spaces between circuits, it was confirmed that no voids were formed.

A printed wiring board was produced in the same manner as described in Example 1.

The resulting printed wiring board was good in both adhesiveness of the electroless plated copper and solder heat resistance at 260° C.

EXAMPLE 5

A composite film interposing a polyimide film as a barrier layer between an additive layer and an insulating layer was prepared by coating the 25% MEK solution for making an additive layer film used in Example 1 on one side of the polyimide film of 7.5 μm so as to make the film thickness 35 μm after dried, and coating the 25% MEK solution for making an insulating layer film used in Example 1 on another side of the polyimide film so as to make the film thickness 100 μm after dried.

The composite film was vacuum laminated (100° C.) on a circuit substrate having comb teeth-like circuits with line and space (L/S) of 0.5 mm (1 ounce of electrodeposited copper) so as to make the insulating layer contact with the circuit substrate. After measuring flowing properties into spaces between circuits, it was confirmed that no voids were formed.

The composite film laminated substrate was cured by heating at 150° C. for 2 hours in a vacuum press under a reduced pressure of 40 Torr with a press pressure of 7 kg/cm$^2$, followed by a roughening treatment using a chromic acid mixed solution according to a usual additive process. After seeding a catalyst and activation treatment, electroless plating was carried out to deposit copper with a predetermined thickness, followed by annealing to give a printed wiring board.

The resulting printed wiring board was good in both adhesiveness of the electroless plated copper and solder heat resistance at 260° C.

COMPARATIVE EXAMPLE 1

| Insulating layer | |
|---|---|
| Epoxy resin (bisphenol-epichlorohydrin type. epoxy equivalent weight 500) | 35 parts |
| NBR (nitrile content 41%) | 105 parts |
| Calcium carbonate | 20 parts |
| Imidazole compound | 2 parts |
| Peroxide | 2.5 parts |
| Diphenylguanidine | 0.1 part |

The ingredients mentioned above were dissolved in MEK to make a 20% MEK solution, which was coated on a releaf film (PET film) so as to make the film thickness 50 μm after dried to form an uncured film (an insulating film). The viscosity of the resulting film measured by DMA was 10$^5$ poises or more at 120° C.

A composite film comprising an additive layer (35 μm) and an insulating layer (100 μm) was obtained by binding the same additive layer film obtained in Example 1 with the insulating layer film mentioned above using a roll laminator at 100° C.

The composite film was vacuum laminated (120° C.) on a circuit substrate having comb teeth-like circuits with line and space (L/S) of 0.5 mm (1 ounce of electrodeposited copper) so as to make the insulating layer contact with the circuit substrate. After measuring flowing properties into spaces between circuits, there were found a number of voids between circuits.

COMPARATIVE EXAMPLE 2

| Insulating layer | |
|---|---|
| Epoxy resin (bisphenol-epichlorohydrin type, epoxy equivalent weight 500) | 130 parts |
| NBIR (nitrile content 35%) | 10 parts |
| Calcium carbonate | 20 parts |
| Imidazole compound | 7 parts |
| Peroxide | 0.3 part |
| Diphenylguanidine | 0.1 part |

The ingredients mentioned above were dissolved in MEK to make a 70% MEK solution, which was coated on a releaf film (PET film) so as to make the film thickness 10 μm after dried to form an uncured film (an insulating film).

A composite film was obtained by binding the same additive layer film obtained in Example 1 with the insulating layer film mentioned above using a roll laminator at 80° C. The viscosity of this complex film measured by DMA was 500 poises at 80° C.

The composite film was vacuum laminated (70° C.) on a circuit substrate having comb teeth-like circuits with line and space (L/S) of 0.5 mm (1 ounce of electrodeposited copper) so as to make the insulating layer contact with the circuit substrate. After measuring flowing properties into spaces between circuits, no voids were found between circuits.

When the composite film laminated substrate was cured by heating at 150° C. for 2 hours, the uniformity of the thickness of insulating layer was lost due to resin flow at the time of heating, resulting in losing surface smoothness of the substrate.

EXAMPLE 6

On both sides of double-sided printed wiring substrate (paper-epoxy resin; LE-144, mfd. by Hitachi Chemical Co., Ltd.) as shown in FIG. 6(A) containing palladium chloride as a plating catalyst, a composite film containing palladium chloride, obtained in the same manner as described in Example 1 and having a structure as shown in FIG. 1 was laminated to give a laminate as shown in FIG. 5. The lamination was carried out in a vacuum laminator under a pressure of 40 Torr at a laminate roll surface temperature of 100° C., a substrate moving speed of 1.3 m/min, and a roll pressure of 3 kg/cm.

After removing the release film from the surfaces, the laminate was cured in an electric oven at 150° C. for 2 hours under an atmospheric pressure. The resulting laminate was subjected to the following tests. The results are shown in Table 1.

(1) Thickness of resin layers

The thickness of the additive layer and the insulating layer was measured by photographing at five cross-sections using an optical microscope, and evaluated by deviations from the predetermined values.

(2) Generation of voids in composite film

Generation of voids in the composite film was examined by observing the resulting laminate by the naked eye.

○: No voids were generated.
X: Voids were generated.

(3) Defects in circuit pattern formation

Circuit patterns were formed on the cured laminate by roughening both surfaces (additive layers) of the laminate with a chromic acid mixed solution, masking non-circuit forming portions with a plating resist by a printing method, and depositing copper on circuit forming portions in the predetermined thickness by electroless copper plating to form conductor circuits. Defects of the circuit patterns were observed by the naked eye.

○: No defect was admitted.
X: Defects were found.
—: Not tested.

(4) Adhesiveness of circuit patterns

The circuit board obtained in above (3) was subjected to peeling of circuit pattern according to JIS C6481 to measure peeling strength ○: Peeling strength of 1.8 kgf/cm or more.
X: Peeling strength is less than 1.8 kgf/cm.
—: Not tested.

EXAMPLE 7

A laminate as shown in FIG. 5 was prepared by laminating a composite film (containing palladium chloride with cured additive layer) obtained in the same manner as described in Example 2 on both sides of double-sided printed wiring substrate (LE-144) as shown in FIG. 6(A) containing palladium chloride. The lamination was carried out in a vacuum laminator under a pressure of 20 Torr at a laminate roll surface temperature of 80° C., a substrate moving speed of 1.3 m/min, and a roll pressure of 4 kg/cm.

The laminate was cured in an electric oven at 150° C. for 1 hour under an atmospheric pressure. Then, the release films were removed form the surfaces of the cured laminate, followed by measurement of various properties in the same manner as described in Example 6. The results are shown in Table 1.

EXAMPLE 8

A laminate as shown in FIG. 5 was prepared by laminating a composite film having a structure as shown in FIG. 4 and obtained in the same manner as described in Example 4 on both sides of double-sided printed wiring substrate (paper-epoxy resin) as shown in FIG. 6(A) (containing no plating catalyst). The lamination was carried out in a vacuum laminator under a pressure of 40 Torr at a laminate roll surface temperature of 100° C., a substrate moving speed of 1.3 m/min, and a roll pressure of 4 kg/cm.

The laminate was cured at 150° C. for 2 hours under a pressure of 7 kg/cm$^2$ in an electric oven kept at a pressure of 5 Torr, followed by measurement of various properties in the same manner as described in Example 6. The results are shown in Table 1.

In evaluating items (3) and (4), the step of addition of palladium chloride as a plating catalyst for activation was inserted after the step of surface roughening and before the step of resist masking.

COMPARATIVE EXAMPLE 3

A laminate as shown in FIG. 5 was prepared by laminating a composite film having a structure as shown in FIG. 1 and obtained in the same manner as described in Example 2 (containing palladium chloride with cured additive layer) on both sides of double-sided printed wiring substrate as shown in FIG. 6(A) (containing palladium chloride). The lamination was carried out using a roll laminator at a laminate roll surface temperature of 100° C., a substrate moving speed of 1.3 m/min, and a roll pressure of 4 kg/cm.

The resulting laminate was subjected to curing treatment in the same manner as described in Example 7, and then subjected to measurement of various properties in the same manner as described in Example 6. The results are shown in Table 1.

TABLE 1

| | Examples | | | Comparative |
|---|---|---|---|---|
| | 6 | 7 | 8 | Example 3 |
| Thickness of resin layers (μm) | | | | |
| Additive layer | −1.0~ +2.0 | −1.0~ +1.0 | −0.5~ +0.5 | −2.0~ +3.0 |
| Insulating layer | −2.0 +2.0 | −1.0 +1.0 | −1.0 +1.0 | −2.0 +4.0 |
| Generation of voids in composite film | ○ | ○ | ○ | X |
| Defects in circuit pattern formation | ○ | ○ | ○ | — |
| Adhesiveness of circuit patterns | ○ | ○ | ○ | — |

As shown in Examples 6 to 8, by laminating the composite films on circuit substrates under reduced pressure, the producing process can be simplified and generation of voids in the individual layers can be prevented.

EXAMPLE 9

An insulating resin layer was formed by coating a resin solution containing 40 parts of an epoxy resin and 100 parts of a modified polybutadiene rubber (carboxyl group-containing polybutadiene) as major components and palladium as a plating catalyst on a polyethylene film to give a sheet.

An adhesive layer was formed by coating a resin solution containing acrylonitrile rubber and an alkyl-phenol resin as major components and palladium as a plating catalyst on a polyethylene film to give a sheet. A composite sheet in a semi-cure state was obtained by roll laminating the above-mentioned sheets.

Figure 7A:
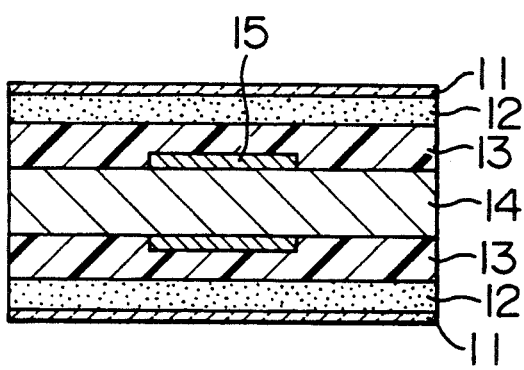
FIGS. 7(A) to 7(F) are cross-sectional views explaining a process of the present invention.

After removing the polyethylene film at the side of insulating resin layer 13, the composite film was laminated on both sides of inner layer circuit substrate 14 obtained by a subtractive process using a heat roll, followed by curing with heating to give a structure as shown in FIG. 7(A).

Figure 7D:
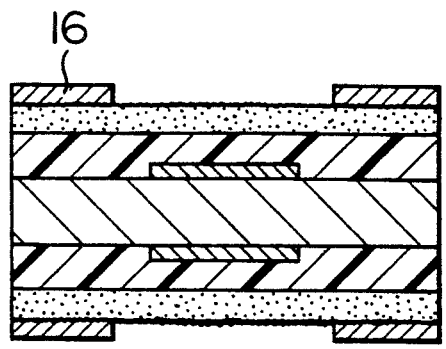
Figure 7B:
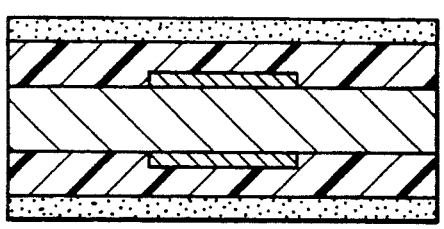
Figure 7E:
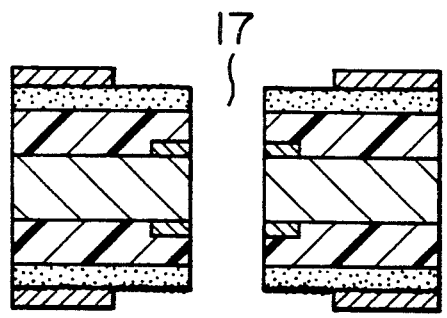
Figure 7C:
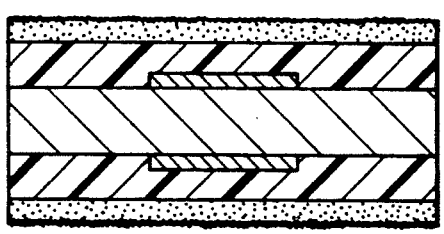

Then, two polyethylene films attached to the adhesive layers were removed (see FIG. 7(B)), followed by chemical roughening as shown in FIG. 7(C). Then, non-circuit forming portions were masked with a permanent resist 16 (ultraviolet curable acrylic resin) as shown in FIG. 7(D).

Figure 7F:
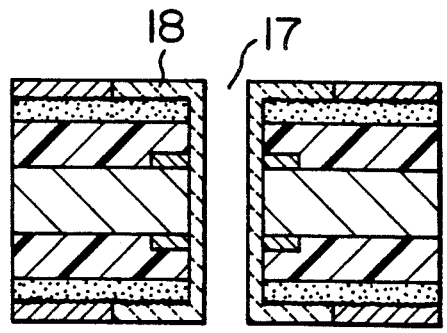

After drilling through-holes 17 as shown in FIG. 7(E), the resulting laminate was dipped in a conventional electroless copper plating solution to form outer layer circuits 18 as shown in FIG. 7(F).

The thus produced printed wiring board was able to form conductor patterns of 0.1 mm or less with excellent adhesiveness of the conductors. Further, peeling strength after high temperature treatment such as dipping in molten solder (about 260° C.) was equal to or higher than that obtained in prior art multi-layer printed wiring boards. This means that the resulting printed wiring board is excellent in reliability.

EXAMPLE 10

An aluminum plate of 1.0 mm thick having a number of through-holes having a diameter of 2 mm was subjected to an etching treatment with a mixed solution of sulfuric acid and chromic acid. After filling the through-holes with a resin composition using a squeegee, surfaces were smoothed. The resin composition contained 100 parts of liquid bisphenol A type epoxy resin (WPE 190), 4 part of an imidazole compound, and 20 parts of a filler (a solventless epoxy resin composition).

A non-vulcanized additive film as shown in FIG. 10 containing a synthetic rubber (NBR)/phenol resin (60/40 weight ratio) as major components was laminated on both sides of the aluminum plate at 120° C. using a hot laminator. The resulting laminate was subjected to peeling of the release films from the laminate surfaces, and cured in an electric oven at 150° C. for 2 hours. The surfaces of the cured additive layer films were smooth.

A printed wiring board was produced by drilling holes of 1 mm in diameter in through-hole portions, roughening the additive layer films on the laminate with a chromic acid mixed solution, adding a plating catalyst (palladium chloride) to the laminate, subjecting the laminate to an activation treatment, printing a plating resist on non-circuit forming portions, and forming conductor patterns in predetermined thickness by an electroless copper plating method, according to a conventional additive process.

The printed wiring board did not show undesirable phenomena such as bulges, peeling, and the like after subjecting to post cure at 160° C. for 1 hour.

The resulting printed wiring board was subjected to the following tests (5), (6) and (7). As a result, the breakdown voltage was 3.5 kV, the peeling strength was 2.2 kg/cm, and the solder resistance was good without bringing about bulges and peeling even if allowed to stand in the molten solder for 30 seconds or more.

(5) Breakdown voltage

From one corner portion of a sample, an additive layer film with a size of 10×10 mm was peeled to expose the aluminum plate. The sample was dipped in mercury in a mercury tank making the exposed portion upside. The distance from the mercury surface to the exposed portion of the aluminum plate was made 10 mm and the exposed portion was prevented from contacting with mercury. The exposed portion was made one electrode and the mercury was made another electrode. To these electrodes, an electric source and apparatus as defined in JIS K-6911-1970 5.8.2 were connected and applied a voltage at 20° C. The voltage was applied from 0 until breakdown took place at a rate of 20 volts/sec. The voltage at the breakdown was used as breakdown voltage.

(6) Peeling

Peeling strength at normal state was measured according to JIS C 6481.5.7.

(7) Solder heat resistance

Solder heat resistance at normal state was measured at 260° C. according to JIS C 6481.5.5.

EXAMPLE 11

On one side of an aluminum plate of 1.0 mm thick having a number of through-holes of 2 mm in diameter at predetermined positions and subjected to an etching treatment with a mixed solution of sulfuric acid and chromic acid, a composite film shown in FIG. 11 comprising a release film 30, a non-vulcanized additive layer film 24 containing a synthetic rubber (NBR)/phenol resin (60/40 weight ratio) as major components (30 μm thick), and a non-vulcanized insulating layer 31 containing a synthetic rubber (NBR)/epoxy resin as major components (100 μm) was laminated so as to make the insulating layer 31 contact with the aluminum plate using a hot laminator at 100° C. The through-holes were filled with the same resin composition as used in Example 10 using a squeeze and smoothed on the surfaces.

On the smoothed surface, the same composite film as mentioned above having the structure as shown in FIG. 11 was laminated so as to make the insulating layer 31 contact with the aluminum plate using a hot laminator at 100° C. The resulting laminate was cured in an autoclave under reduced pressure of 5 Torr, while heating at 150° C. for 2 hours under a pressure of 7 kg/cm². After curing, the surfaces of the additive layer films were smooth.

A printed wiring board was produced in the same manner as described in Example 10 after drilling holes of 1 mm in diameter at the through-hole portions.

The resulting wiring board was subjected to the tests in the same manner as described in Example 10. As a result, the breakdown voltage was 4.5 kV, the peeling strength was 2.0 kg/cm, and the solder resistance was good without bringing about bulges and peeling even if allowed to stand in the molten solder for 30 seconds or more.

EXAMPLE 12

An aluminum plate of 1.0 mm thick having a number of through-holes of 2 mm in diameter at predetermined positions was etched with a mixed solution of sulfuric acid and chromic acid, followed by filling the through-holes with the same resin composition as used in Example 10 using a squeegee and smoothing the surfaces thereof.

Figure 12:
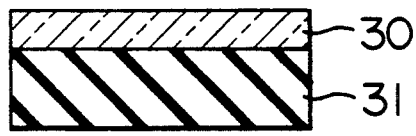
FIG. 12 is a cross-sectional view of a composite film comprising a releasable film and an insulating film.
Figure 13:
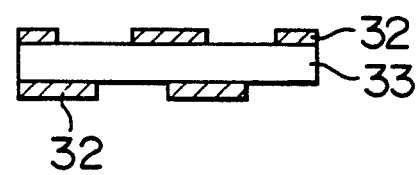
FIG. 13 is a cross-sectional view of a double-sided printed circuit board.
Figure 14:
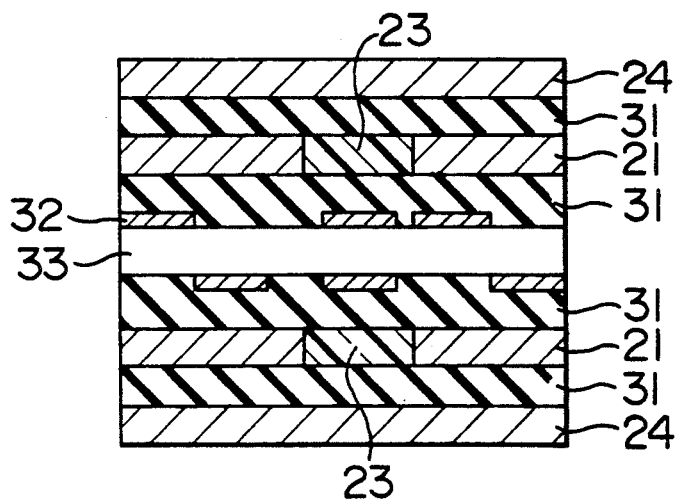
FIG. 14 is a cross-sectional view of a composite laminated product.

One surface of the aluminum plate thus smoothed was laminated with the same composite film as used in Example 11 (containing palladium chloride) so as to make the insulating layer contact with the aluminum plate, and another surface of the aluminum plate was laminated with a composite film as shown in FIG. 12 comprising a release film 30 and an insulating layer 31 (having the same component as mentioned above) so as to make the insulating layer 31 contact with the aluminum plate, using a hot laminator at 100° C. to give a laminate. Then, on both sides of double-sided printed wiring substrate (glass cloth-epoxy resin) as shown in FIG. 13 (containing palladium chloride) obtained by forming circuits 32 on both side of a substrate 33, the resulting laminate, from which the release film 30 shown in FIG. 12 was removed, was laminated so as to make both insulating layers 31 contact with the circuits 32 to give a composite laminate as shown in FIG. 14.

The resulting composite laminate was subjected to a curing treatment in an autoclave under a reduced pressure of 5 Torr, while heating at 150° C. for 2 hours under a pressure of 7 kg/cm$^2$. After curing, the surface release films were peeled. The surfaces of the additive layer films were smooth.

A printed wiring board was produced by drilling holes of 1 mm in diameter in the through-hole portions, roughening the additive layer films with a chromic acid mixed solution, printing a plating resist on non-circuit forming portions, and forming conductor patterns in predetermined thickness by an electroless copper plating method, according to a conventional additive process.

The resulting printed wiring board did not show undesirable phenomena such as bulges, peeling, and the like after subjecting to post cure at 160° C. for 1 hour.

Then, the printed wiring board was subjected to the tests in the same manner as described in Example 10. As a result, the breakdown voltage was 4.2 kV, the peeling strength was 2.2 kg/cm, and the solder heat resistance was good without bringing about bulges and peeling even if allowed to stand in the molten solder for 30 seconds or more.

COMPARATIVE EXAMPLE 4

Resin powders containing a synthetic rubber (NBR) and alkyl phenol resin (60/40 weight ratio) as major components were floated in an electrostatic-fluidized bed, in which an aluminum plate of 1.0 mm thick having a number of through-holes of 1 mm in diameter was immersed to form a resin layer of 100 μm thick on surfaces of the aluminum plate. Using this aluminum plate, a sample of printed wiring board was produced in the same manner as described in Example 10.

The sample was subjected to the same tests as described in Example 10. The breakdown voltage at through-hole edge portions was remarkably as low as 0.5 kV.

As explained in Examples 10 to 12 and Comparative Example 4, since the printed wiring boards are produced by filling through-holes in a metal plate with a resin composition, laminating uncured additive layer films on surfaces of the metal plate, curing the additive layer films with heating, drilling through-holes in smaller diameter than the original one, and forming conductor circuits by an electroless copper plating, the resulting wiring boards are good in heat dissipation, and high in insulation reliability due to generation of no pin holes. Further, since the surfaces are smooth, high density wiring becomes possible.

What is claimed is:

1. A process for producing a printed wiring board, which comprises
    laminating a composite film comprising an adhesive layer and an insulating layer containing an epoxy resin and a synthetic rubber as major components on both sides of a substrate under reduced pressure, the viscosity of the insulating layer of the composite film at the time of laminating on the substrate being in the range of $10^3$ to $10^5$ poise,
    curing the resulting laminate with heating,
    drilling through-holes in the resulting laminate,
    masking non-circuit forming portions with a plating resist,
    dipping the resulting laminate in a chemical roughening solution to selectively roughen circuit forming portions not masked with the resist, and
    dipping the resulting laminate in an electroless copper plating solution to form conductor patterns.

2. A process according to claim 1, wherein the curing of the laminate with heating is carried out under an atmospheric pressure.

3. A process according to claim 1, wherein the substrate comprises an inner layer circuit substrate having a conductor circuit formed thereon.

4. A process according to claim 1, wherein said adhesive layer comprises an organic layer on which electrical circuits can be formed by electroless plating.

5. A process according to claim 1, wherein the adhesive layer of the composite film is placed in contact with the substrate during lamination.

6. A process according to claim 5, wherein the mixing ratio of the epoxy resin to the synthetic rubber is in the range of 30/70 to 90/10.

7. A process for producing a multi-layer printed wiring board, which comprises
    binding a composite film comprising an insulating resin layer and an adhesive layer to both sides of an inner layer circuit substrate so as to contact the insulating resin layer with the inner layer circuit substrates,
    heating under pressure the resulting laminate to bind, the insulating resin layer having greater flowing properties than the adhesive layer at the time of binding with heating under pressure,
    drilling through-holes in the resulting laminate,
    masking non-circuit portions with a plating resist,
    dipping the resulting laminate in a chemical roughening solution to selectively roughen circuit forming portions not masked with the resist, and
    dipping the resulting laminate in an electroless copper plating solution to form conductor patterns.

8. A process according to claim 7, wherein at least one of the insulating resin layer and the adhesive layer contains a catalyst for electroless plating.

9. A process according to claim 7, wherein the insulating resin layer contains an epoxy resin and a synthetic rubber as major components, the mixing ratio of the epoxy resin to the synthetic rubber being in a range of 30/70 to 90/10.

10. A process according to claim 7, wherein the adhesive layer comprises a resinous layer suitable for forming electrical circuits thereon by electroless plating.

11. A process for producing a multi-layer printed wiring board, which comprises binding a composite film comprising an insulating resin layer and an adhesive layer to both sides of an inner layer circuit substrate so as to contact the insulating resin layer with the inner layer circuit substrate, the composite film further comprising an insulating film laminated on the adhesive layer, heating under the resulting laminate to bind, drilling through-holes in the resulting laminate, masking non-circuit forming portions with a plating resist, dipping the resulting laminate in a chemical roughening solution to selectively roughen circuit forming portions not masked with the resist, and dipping the resulting laminate in an electroless copper plating solution to form conductor patterns.

12. A process according to claim 11, wherein the insulating film is removed after heating under pressure the resulting laminate to bind.

* * * * *